US008242709B2

(12) United States Patent
Nogami et al.

(10) Patent No.: US 8,242,709 B2
(45) Date of Patent: Aug. 14, 2012

(54) OPTICAL TRANSMITTER

(75) Inventors: Masamichi Nogami, Tokyo (JP); Masaki Noda, Tokyo (JP); Naoki Suzuki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 261 days.

(21) Appl. No.: 12/668,751

(22) PCT Filed: Jul. 13, 2007

(86) PCT No.: PCT/JP2007/064001
§ 371 (c)(1),
(2), (4) Date: Jan. 12, 2010

(87) PCT Pub. No.: WO2009/011019
PCT Pub. Date: Jan. 22, 2009

(65) Prior Publication Data
US 2010/0181937 A1 Jul. 22, 2010

(51) Int. Cl.
G05F 1/00 (2006.01)
(52) U.S. Cl. ..... 315/300; 315/308; 315/309; 315/169.1; 372/38.07; 372/38.02; 372/38.1; 372/34; 372/29.02
(58) Field of Classification Search ................ 315/291, 315/297, 169.1, 169.3, 300, 307–309, 360; 372/26, 29.011, 29.015, 29.02, 29.021, 34, 372/38.02, 38.04, 38.07, 38.1
See application file for complete search history.

(56) References Cited

U.S. PATENT DOCUMENTS

| 5,625,616 | A | * | 4/1997 | Koike et al. ............... 369/53.26 |
| 6,097,159 | A | | 8/2000 | Mogi et al. |
| 7,030,418 | B2 | * | 4/2006 | Sasada et al. .................. 257/81 |
| 7,312,473 | B2 | * | 12/2007 | Koyama et al. ................ 257/88 |
| 7,483,460 | B2 | * | 1/2009 | Hayashi ...................... 372/38.1 |
| 7,570,680 | B2 | * | 8/2009 | Nishiyama ................ 372/38.02 |
| 7,715,728 | B2 | * | 5/2010 | Kijima et al. ................. 398/182 |

FOREIGN PATENT DOCUMENTS

JP 3-214935 9/1991
JP 7 7204 1/1995
(Continued)

OTHER PUBLICATIONS

Extended European Search Report issued Dec. 7, 2011 in patent application No. 07790781.4.

*Primary Examiner* — Haiss Philogene
(74) *Attorney, Agent, or Firm* — Oblon, Spivak, McClelland, Maier & Neustadt, L.L.P.

(57) ABSTRACT

An optical transmitter includes a light-emitting device and an optical modulator that modulates light output from the light-emitting device by using an input signal. The optical transmitter includes a drive current switching controller that performs an ON/OFF switching control of a drive current of the light-emitting device, by using an ON/OFF signal as an input that controls ON/OFF of an optical output of the light-emitting device, in response to a switching of the ON/OFF signal. The optical transmitter also includes a drive current adjusting and generating unit that detects an ambient temperature, and generates a drive current that is adjusted according to the ambient temperature detected thereby. The drive current switching controller includes a differential circuit that is supplied a drive current that is generated by the drive current adjusting and generating unit and controls the drive current that is output to the light-emitting device, according to the ON/OFF signal.

4 Claims, 4 Drawing Sheets

FOREIGN PATENT DOCUMENTS

| | | |
|---|---|---|
| JP | 9 83050 | 3/1997 |
| JP | 10 209537 | 8/1998 |
| JP | 10 270784 | 10/1998 |
| JP | 11 74567 | 3/1999 |
| JP | 11 251668 | 9/1999 |
| JP | 2000 89178 | 3/2000 |
| JP | 2000 286344 | 10/2000 |
| JP | 2001 358661 | 12/2001 |
| JP | 2002 9387 | 1/2002 |
| JP | 2002 246685 | 8/2002 |
| JP | 2003 37484 | 2/2003 |

* cited by examiner

Conventional Technology

Conventional Technology

Conventional Technology

OPTICAL TRANSMITTER

TECHNICAL FIELD

The present invention relates to an optical transmitter employing an optical modulator, and more particularly, to an optical transmitter in which a high-speed ON/OFF control of the emission of bias light that is to be modulated is performed.

BACKGROUND ART

Optical transmitters are provided in, for example, an optical communication system, and converts electrical signals to optical signals so as to transmit the thus converted optical signals. Conventional optical transmitters are described in, for example, Patent Documents 1 and 2.

Patent Document 1 describes an optical transmitter that includes a laser diode (LD) as an optical source; a transistor into which an ON/OFF signal of the LD (hereinafter, "LD ON/OFF signal") is input and that controls a drive current of the LD accordingly; and an external modulator that modulates light output from the LD with an input signal. The circuit of such an optical transmitter is configured in such a manner that the collector of the transistor is connected to the cathode of the LD, a load resistor is provided between the emitter of the transistor and the ground (GND), and an LD ON/OFF signal is input to the base of the transistor. Thus, ON/OFF of the laser diode (LD) is controlled.

Patent Document 2 describes an optical transmitter that further includes a photodiode (PD) that detects an optical output from the LD; and a feedback control circuit such as a feedback automatic power control (APC) circuit connected to the PD, in addition to the configuration of the optical transmitter described in Patent Document 1. In such an optical transmitter, an LD drive current is controlled by using the feedback control circuit according to the detection results of the optical output from the LD detected by the PD, to thereby control the optical output from the LD to be made constant. In this optical transmitter also, the optical output can be turned ON or OFF according to the LD ON/OFF signal.

[Patent Document 1] Japanese Patent Application Laid-open No. H9-83050
[Patent Document 2] Japanese Patent Application Laid-open No. 2000-89178

DISCLOSURE OF INVENTION

Problem to be Solved by the Invention

The conventional technologies described above, however, have a following problem. That is, in the conventional optical transmitters, it is difficult to perform high-speed ON/OFF control of bias light that is input to the external modulator.

For example, in the optical transmitter disclosed in Patent Document 1, the LD ON/OFF function thereof is not meant for high-speed operation. Therefore, ON/OFF stabilization of a drive current takes time, and thus, high-speed ON/OFF control cannot be performed therein. Actually, when a waveform of the LD drive current for the LD ON/OFF signal is examined, it can be determined that it takes time for a current value with the signal being ON to become stable at a predetermined value when the signal is switched from OFF to ON, and it takes time for a current thereof to become 0 when the signal is switched from ON to OFF.

In the optical transmitter disclosed in Patent Document 2, since a feedback APC is used to stabilize the optical output from the LD, a loop circuit is disconnected according to the LD ON/OFF signal. Therefore, it takes some time for the drive current to return to a stable state. As a result, the ON/OFF stabilization of the drive current still requires some time.

In view of the foregoing, an object of the present invention is to provide an optical transmitter in which high-speed ON/OFF control of bias light that is input to the optical modulator can be performed.

Means for Solving Problem

In order to solve the aforementioned problems, an optical transmitter according to the present invention is constructed in such a manner that it comprises: a light-emitting device; an optical modulator that modulates light output from the light-emitting device by using an input signal; a drive current switching controller that performs ON/OFF switching control of a drive current of the light-emitting device, by using as an input an ON/OFF signal that controls ON/OFF of an optical output of the light-emitting device, in response to switching of the ON/OFF signal; and a drive current adjusting and generating unit that detects ambient temperature, and generates the drive current that is adjusted according to the ambient temperature detected thereby.

EFFECT OF THE INVENTION

According to the present invention, a drive current is generated by a drive current adjusting and generating unit such as a temperature detecting current generation circuit, and an ON/OFF switching control of the drive current of a light-emitting device is performed by a drive current switching controller such as a high-speed current switching circuit according to an ON/OFF signal. Therefore, high-speed ON/OFF control of the optical output from the light-emitting device can be performed.

EXPLANATIONS OF LETTERS OR NUMERALS

Figure 1:
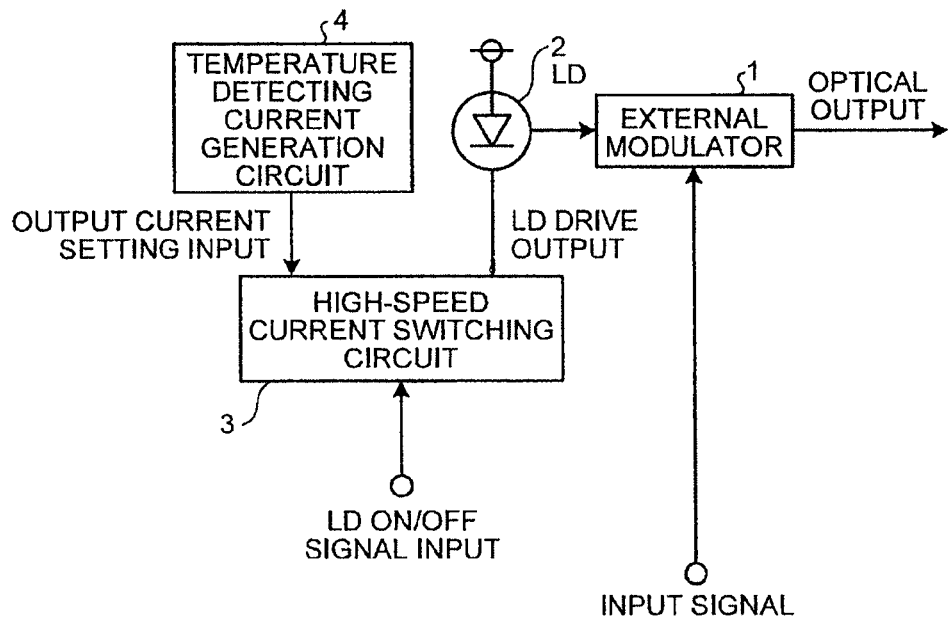
FIG. 1 is a block diagram of an optical transmitter according to a first embodiment of the present invention.

1, 100 external modulator
2, 102 LD
3 high-speed current switching circuit
4 temperature detecting current generation circuit
5 signal head detecting circuit
6, 7, 9, 11, 113 transistor
8, 10, 12, 114 load resistor
20 differential circuit 21 current mirror
116 PD
117 feedback control circuit

BEST MODE(S) FOR CARRYING OUT THE INVENTION

An optical transmitter according to the present invention is described below in detail with reference to the accompanying drawings. The present invention is, however, not limited thereto.

First Embodiment

Figure 3:
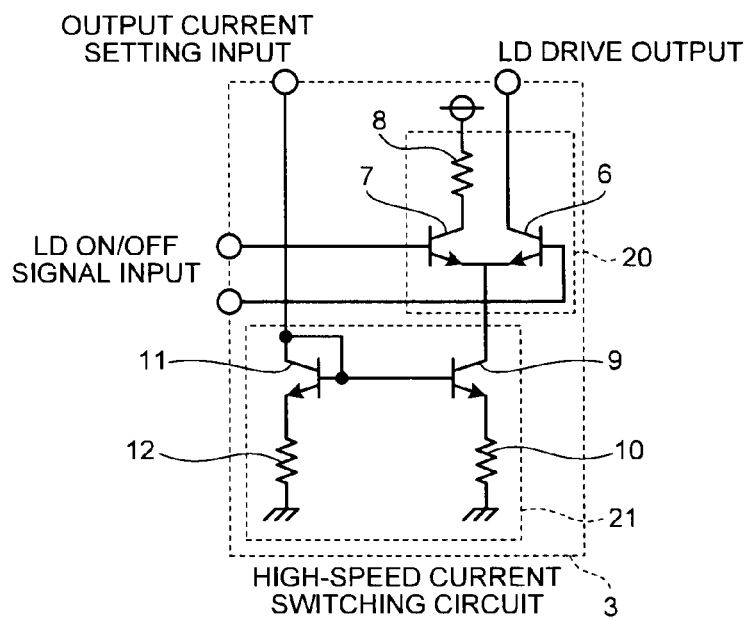
FIG. 3 is a circuit diagram of a configuration of a high-speed current switching circuit according to the first embodiment.

FIG. 1 is a block diagram of an optical transmitter according to a first embodiment of the present invention. FIG. 3 is a circuit diagram of a configuration of a high-speed current switching circuit according to the first embodiment.

As shown in FIG. 1, the present embodiment includes an external modulator 1; a device such as an LD 2 that serves as a light-emitting device that converts a current signal into light; a high-speed current switching circuit 3 that serves as a drive current switching controller; and a temperature detecting current generation circuit 4 that serves as a drive current adjusting and generating unit.

The LD 2 is an optical source, and an optical output from the LD 2 is input to the external modulator 1. The external modulator 1 is an optical modulator that modulates the light output from the LD 2 by using an input signal that is a transmission data.

The high-speed current switching circuit 3 is connected to the cathode of the LD 2, and performs high-speed ON/OFF control of a drive current of the LD 2 by using an LD ON/OFF signal as an input signal, which is used to perform ON/OFF control of an optical output from the LD 2. The high-speed current switching circuit 3 is connected to the temperature detecting current generation circuit 4. The temperature detecting current generation circuit 4 detects an ambient temperature, and sets a drive current at the time when the LD 2 is turned ON so that an optical output level of the LD 2 is not affected by a fluctuation of the ambient temperature. In other words, the temperature detecting current generation circuit 4 generates a current according to the detection results of the ambient temperature, and the high-speed current switching circuit 3 sets a drive current at the time when the LD 2 is turned ON, according to the current generated by the temperature detecting current generation circuit 4.

The operation performed by the configuration shown in FIG. 1 is described below. DC emitted light generated by the LD 2 is input to the external modulator 1, and then modulated by an input signal that is input to the external modulator 1 through an input signal terminal, and the thus modulated optical output is further transmitted therefrom. The high-speed current switching circuit 3 performs a high-speed ON/OFF control of a drive current of the LD 2 (LD drive output) according to an LD ON/OFF signal (LD ON/OFF signal input) that is input thereto, so as to perform thereby a high-speed ON/OFF control of the optical output from the LD 2. The temperature detecting current generation circuit 4 sets an optimal preset value for each temperature level so that an optical output level of the LD 2 is constant, not being dependent on temperature. The high-speed current switching circuit 3 uses an optimal current that is set by the temperature detecting current generation circuit 4 as an input (output current setting input), and accordingly sets an LD drive output that is a drive current of the LD 2. Thus, an optical output level of the LD 2 at the time when the LD 2 is turned ON is controlled so as to be made constant without being dependent on temperature.

FIG. 3 is a circuit diagram of a configuration of the high-speed current switching circuit according to the present embodiment. As shown in FIG. 3, the high-speed current switching circuit 3 is equipped with a differential circuit 20 and a current mirror circuit 21.

The differential circuit 20 includes a first transistor 6, a second transistor 7, and a load resistor 8. The first and the second transistors 6 and 7 have a common emitter, and an end of the load resistor 8 is connected to the collector of the transistor 7. The collector of the transistor 6 is connected to an LD drive output terminal and to the cathode of the LD 2. The potential of the other end of the load resistor 8 is set to be identical to the potential on the anode side of the LD 2. An LD ON/OFF signal input terminal includes 2 terminals. One terminal is connected to the base of the transistor 6, and the other end is connected to the base of the transistor 7. The emitter that is common to the transistors 6 and 7 is connected to the current mirror circuit 21.

The current mirror circuit 21 includes a first transistor 9; a second transistor 11; a load resistor 10 that is provided between the transistor 9 and the GND; and a load resistor 12 that is provided between the transistor 11 and the GND. The collector of the transistor 9 is connected to the emitter that is common to the transistors 6 and 7, and the emitter of the transistor 9 is connected to the GND through the load resistor 10. The collector of the transistor 11 is connected to an output current setting input terminal and further to the temperature detecting current generation circuit 4. The emitter of the transistor 11 is connected to the GND through the load resistor 12, and the base and the collector of the transistor 11 are connected to each other. The bases of the transistors 9 and 11 are connected to each other.

The operation performed by the high-speed current switching circuit 3 is described below. A current generated by the temperature detecting current generation circuit 4 is input to the current mirror circuit 21 through the output current setting input terminal. In the current mirror circuit 21, a current that is identical to the current flowing in the transistor 11 flows in the transistor 9 in the same direction. Therefore, the current that is input to the output current setting input terminal is supplied to the differential circuit 20 through the current mirror circuit 21. The differential circuit 20 switches current paths according to the LD ON/OFF signal that is input through the LD ON/OFF signal input terminal, and outputs the current that is supplied thereinto. That is, for example, when an ON signal is input from the LD ON/OFF signal input terminal, a positive phase and a negative phase signals are applied to the bases of the transistors 6 and 7, respectively, and thus, the drive current supplied from the current mirror circuit 21 flows into the transistor 6, but not into the transistor 7. Therefore, when the LD 2 is turned ON, the LD drive current that is the LD drive output is determined according to the current that is input to the output current setting input terminal. When an OFF signal is input thereto through the LD ON/OFF signal input terminal, the signals that are input to the bases of the transistors 6 and 7 oppose to the case described above, and the LD drive current is not output to the LD. Thus, in the present embodiment, high-speed ON/OFF control of the LD drive current is performed by employing the high-speed current switching circuit 3 including, for example, the differential circuit 20.

Figure 4:
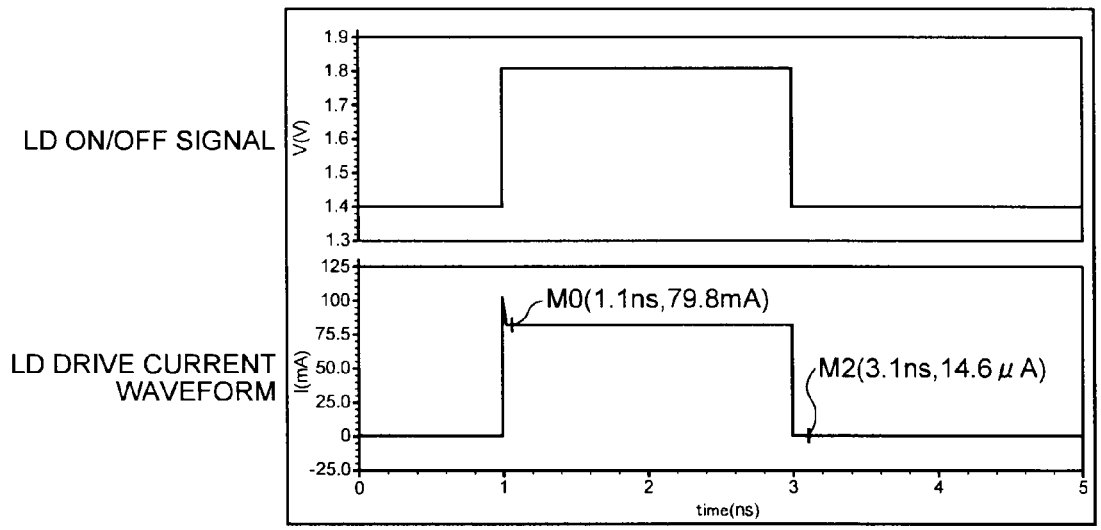
FIG. 4 is a schematic of a simulation result of an LD drive current waveform for an LD ON/OFF signal in the circuit configuration shown in FIG. 3.

FIG. 4 is a schematic of a simulation result of an LD drive current waveform for the LD ON/OFF signal, explaining an effect of the circuit shown in FIG. 3. In the graph of the LD ON/OFF signal in the upper half of FIG. 4, the horizontal axis denotes time (ns) and the vertical axis denotes voltage (V). Note that ns denotes nanosecond. The LD ON/OFF signal is 1.4 (V) at the OFF state during 0 to 1 (ns), 1.8 (V) at the ON state during 1 to 3 (ns), and 1.4 (V) at the OFF state during 3 to 5 (ns). In the graph of the LD drive current waveform in the lower half of FIG. 4, the horizontal axis denotes time (ns) and the vertical axis denotes current (mA). It can be observed that when the LD ON/OFF signal is switched from the OFF state to the ON state, the drive current is stabilized only 100 picoseconds after the start of the ON signal, so that a desired drive current can be started to flow. In fact, it can be understood that the drive current is already stabilized at the point of M0 (1.1 nanoseconds, 79.8 milliamperes), and that high-speed stabilization of the drive current can be performed. On the other hand, when the LD ON/OFF signal is switched from the ON state to the OFF state, the current value already reads 14.6 microampere in only 100 picoseconds after the LD ON/OFF signal is switched to the OFF signal (see the point M2 (3.1 nanoseconds, 14.6 microamperes)). As described later, it can be understood that the current value is made less than a half of the conventional value. Thus, higher-speed switching of the LD drive current can be performed compared with a conventional optical transmitter.

To make the difference between effects of the present embodiment and effects of conventional optical transmitters clear, the optical transmitters disclosed in Patent Documents 1 and 2 are described with reference to FIGS. 5 to 7.

Figure 5:
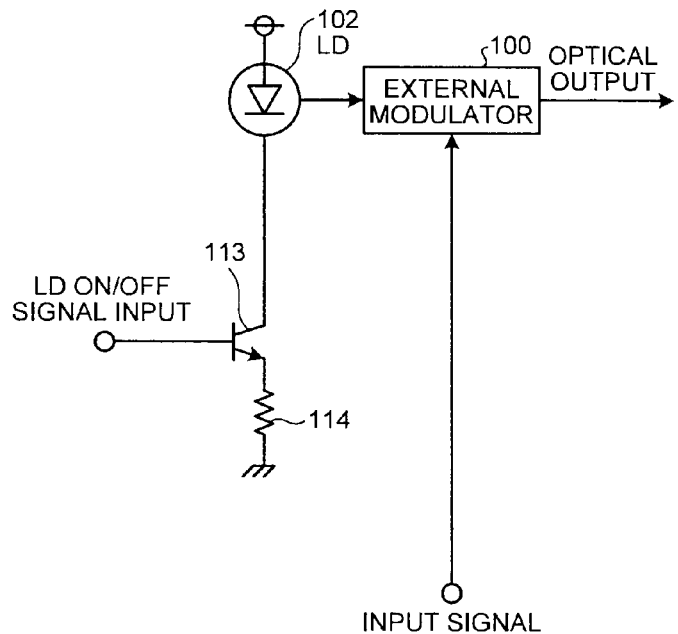
FIG. 5 is a block diagram of a conventional optical transmitter disclosed in Patent Document 1.

FIG. 5 is a block diagram of the conventional optical transmitter disclosed in Patent Document 1. As shown in FIG. 5, the conventional optical transmitter includes an LD 102 that serves as an optical source; an external modulator 100 that modulates light output from the LD 102 by using an input signal, and outputs the light thus modulated; a transistor 113 into which an ON/OFF signal of the LD 102 is input and that controls a drive current of the LD 102; and a resistor 114 provided between the transistor 113 and the GND.

The collector of the transistor 113 is connected to the cathode of the LD 102, and the resistor 114 is provided between the emitter of the transistor 113 and the GND. An LD ON/OFF signal is input to the base of the transistor 113, and the ON/OFF control of the LD 102 is performed according to the LD ON/OFF signal.

Figure 6:
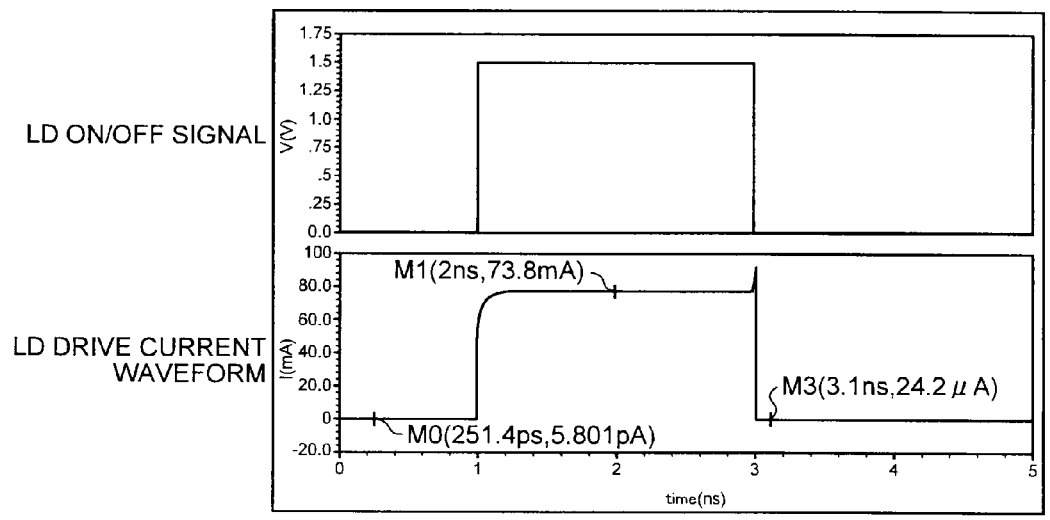
FIG. 6 is a schematic of a simulation result of an LD drive current waveform for an LD ON/OFF signal in a circuit configuration shown in FIG. 5.

FIG. 6 is a schematic of a simulation result of an LD drive current waveform for an LD ON/OFF signal in a circuit configuration shown in FIG. 5. The LD ON/OFF function in a conventional optical transmitter, however, is not meant for a high-speed operation. Thus, in FIG. 6, the result of the simulation is shown in which an ultra-high speed transistor having a transition frequency of ft=100 gigahertz is used in the circuit configuration shown in FIG. 5.

In the graph of the LD ON/OFF signal in the upper half of FIG. 6, the horizontal axis denotes time (ns), and the vertical axis denotes voltage (V). The LD ON/OFF signal is 0 (V) at the OFF state during 0 to 1 (ns), at a stable voltage of 1.5 (volts) at the ON state during 1 to 3 (ns), and 0 (volt) at the OFF state during 3 to 5 (ns). In the graph of the LD drive current waveform in the lower half of FIG. 6, the horizontal axis denotes time (ns), and the vertical axis denotes current (mA). In this conventional configuration, when the LD ON/OFF signal is switched from the OFF state to the ON state, it takes more than about 1 (ns) until a current value of the LD drive current waveform becomes generally stable to be a constant value. In other words, a drive current is not stabilized from the time at which the signal is switched into the ON state to the time M1 (2 nanoseconds, 73.8 milliampere). It can be understood that it takes considerably more time in comparison with the present embodiment (the current value is stabilized about in 100 (ps)). When the LD ON/OFF signal is switched from the ON state to the OFF state, a current of about 24 (μA) is flowing at 0.1 (ns) after the LD ON/OFF signal is switched into the OFF state, as shown in the point M3 (3.1 nanoseconds, 24.2 microampere). Thus, it can be understood that the stabilization takes considerably more time in comparison with the present embodiment (14.6 (μA) at 0.1 (ns) after the signal is switched into the OFF state). At the point M0 (251.4 picoseconds, 5.801 picoamperes), a current value is about 5.8 (pA), that is, in a stable state at the time when the LD ON/OFF signal is switched into the OFF state. Thus, in the optical transmitter disclosed in Patent Document 1, current ON/OFF stabilization is time consuming, and thus, high-speed ON/OFF control is not achieved. On the other hand, in the present embodiment, it can be understood that high-speed ON/OFF control is achieved.

Figure 7:
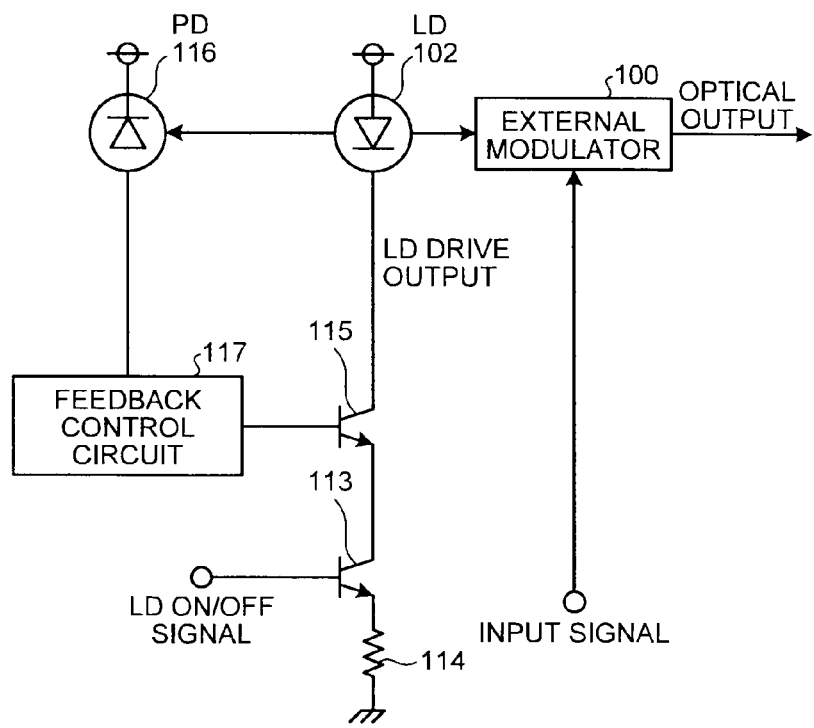
FIG. 7 is a block diagram of a conventional optical transmitter disclosed in Patent Document 2.

FIG. 7 is a block diagram of the conventional optical transmitter disclosed in Patent Document 2. As shown in FIG. 7, the conventional optical transmitter is equipped with a photodiode (PD) 0116 that detects an optical output of the LD 102; a feedback control circuit 117 such as a feedback APC circuit connected to the PD 116; and a transistor 115 connected to the feedback control circuit 117, in addition to the configuration shown in FIG. 5.

The collector of the transistor 115 is connected to the cathode of the LD 102, and the emitter of the transistor 115 is connected to the collector of the transistor 113. The base of the transistor 115 is connected to the feedback control circuit 117. The other constituent elements are identical to those shown in FIG. 5. Therefore, the same reference numerals are used for the identical constituent elements, and their detailed descriptions are omitted.

In the conventional optical transmitter disclosed in Patent Document 2, that is configured as described above, the optical output emitted from the LD 102 is detected as photoelectromotive force generated in the PD 116. Based on the detection results of the optical output, the LD drive output is controlled by using the feedback control circuit. Thus, the optical output of the LD is controlled so as to be constant. In the configuration shown in FIG. 7, however, the feedback APC is used to stabilize the optical output, and the loop circuit is disconnected due to the LD ON/OFF signal. Therefore, unfortunately, it takes time of the millisecond-order until the optical output is stabilized, and high-speed ON/OFF control is thus not achieved.

As described above, in the present embodiment, it is made possible to control high-speed ON/OFF of the drive current of the LD 2 by providing the high-speed current switching circuit 3. As a result, high-speed ON/OFF control of the optical output from the LD 2 can be performed. The temperature detecting current generation circuit 4 is provided in the optical transmitter, and the drive current of the LD 2 is adjusted in accordance with the ambient temperature. Thus, the optical output from the LD 2 can be controlled so as to be constant without being dependent on the ambient temperature.

Second Embodiment

Figure 2:
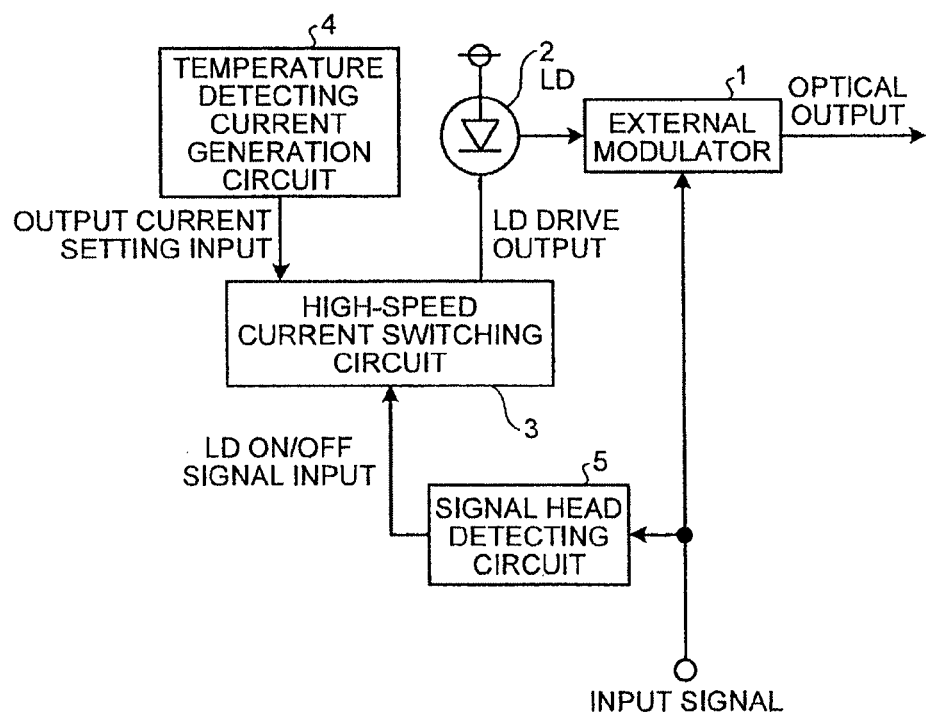
FIG. 2 is a block diagram of an optical transmitter according to a second embodiment of the present invention.

FIG. 2 is a block diagram of an optical transmitter according to a second embodiment of the present invention. As shown in FIG. 2, the present embodiment further includes a signal head detecting circuit 5, in addition to the first embodiment shown in FIG. 1. The signal head detecting circuit 5 is connected to the input signal terminal and to the high-speed current switching circuit 3. In FIG. 2, the same reference numerals are used for the identical constituent elements shown in FIG. 1. The circuit configuration of the high-speed current switching circuit 3 according to the present embodiment is similar to that in the first embodiment, for example, the one shown in FIG. 3.

The operation performed in the present embodiment is described below. An input signal that is input to the external modulator 1 is also input to the signal head detecting circuit 5. The signal head detecting circuit 5 detects an identification signal that indicates the head position of the input signal, and generates an LD ON/OFF signal synchronously with the detection of the identification signal. Then, the signal head detecting circuit 5 outputs the LD ON/OFF signal generated thereby to the high-speed current switching circuit 3.

In the present embodiment, the signal head detecting circuit 5 detects an identification signal that indicates the head position of an input signal, and generates an LD ON/OFF signal. Therefore, an optical output can be easily obtained that is synchronized with the input signal. The other configurations, the operations, the effects, and the like of the present embodiment are identical to those in the first embodiment.

Industrial Applicability

As described above, an optical transmitter according to the present invention is useful as an optical transmitter that can perform high-speed ON/OFF control of bias light that is input to an optical modulator, and can be preferably applied to an optical communication system.

The invention claimed is:

1. An optical transmitter, comprising:
   a light-emitting device;
   an optical modulator that modulates light output from the light-emitting device by using an input signal;
   a drive current switching controller that performs an ON/OFF switching control of a drive current of the light-emitting device, by using an ON/OFF signal as an input that controls ON/OFF of an optical output of the light-emitting device, in response to a switching of the ON/OFF signal; and
   a drive current adjusting and generating unit that detects an ambient temperature, and generates a drive current that is adjusted according to the ambient temperature detected thereby, wherein the drive current switching controller includes a differential circuit that is supplied a drive current that is generated by the drive current adjusting and generating unit and controls the drive current that is output to the light-emitting device, according to the ON/OFF signal.

2. An optical transmitter comprising:
   a light-emitting device;
   an optical modulator that modulates light output from the light-emitting device by using an input signal;
   a drive current switching controller that performs an ON/OFF switching control of a drive current of the light-emitting device, by using an ON/OFF signal as an input that controls ON/OFF of an optical output of the light-emitting device, in response to a switching of the ON/OFF signal; and
   a drive current adjusting and generating unit that detects an ambient temperature, and generates a drive current that is adjusted according to the ambient temperature detected thereby, wherein the drive current switching controller includes a current mirror circuit and a differential circuit that is connected to the current mirror circuit,
   the current mirror circuit supplies to the differential circuit a drive current that is generated by the drive current adjusting and generating unit and input from the drive current adjusting and generating unit, and
   the differential circuit controls the drive current that is output from the current mirror circuit to the light-emitting device, according to the ON/OFF signal.

3. The optical transmitter according to claim 2, further comprising:
   a signal head detecting circuit that detects an identification signal that indicates a head position of the input signal, generates the ON/OFF signal synchronously with a detection of the identification signal, and outputs the ON/OFF signal to the drive current switching controller.

4. An optical transmitter comprising:
   a light-emitting device;
   an optical modulator that modulates light output from the light-emitting device by using an input signal;
   a drive current switching controller that performs an ON/OFF switching control of a drive current of the light-emitting device, by using an ON/OFF signal as an input that controls ON/OFF of an optical output of the light-emitting device, in response to a switching of the ON/OFF signal;
   a drive current adjusting and generating unit that detects an ambient temperature, and generates a drive current that is adjusted according to the ambient temperature detected thereby; and
   a signal head detecting circuit that detects an identification signal that indicates a head position of the input signal, generates the ON/OFF signal synchronously with a detection of the identification signal, and outputs the ON/OFF signal to the drive current switching controller.

* * * * *